United States Patent
Lai

(10) Patent No.: US 9,355,704 B2
(45) Date of Patent: May 31, 2016

(54) REFRESH METHOD FOR SWITCHING BETWEEN DIFFERENT REFRESH TYPES BASED ON AT LEAST ONE PARAMETER OF VOLATILE MEMORY AND RELATED MEMORY CONTROLLER

(71) Applicant: MEDIATEK INC., Hsin-Chu (TW)

(72) Inventor: Guan-Ying Lai, Keelung (TW)

(73) Assignee: MEDIATEK INC., Science-based Industrial, Hsin-Chu (TW)

( * ) Notice: Subject to any disclaimer, the term of this patent is extended or adjusted under 35 U.S.C. 154(b) by 129 days.

(21) Appl. No.: 13/966,303

(22) Filed: Aug. 14, 2013

(65) Prior Publication Data

US 2014/0185403 A1    Jul. 3, 2014

Related U.S. Application Data

(60) Provisional application No. 61/746,682, filed on Dec. 28, 2012.

(51) Int. Cl.
*G11C 11/406* (2006.01)

(52) U.S. Cl.
CPC .... *G11C 11/40618* (2013.01); *G11C 11/40626* (2013.01)

(58) Field of Classification Search
CPC ........... G11C 11/406; G11C 11/40611; G11C 11/40618; G11C 11/40622; G11C 11/40626
See application file for complete search history.

(56) References Cited

U.S. PATENT DOCUMENTS

| 6,879,536 | B2 * | 4/2005 | Lee | 365/222 |
|---|---|---|---|---|
| 2002/0191467 | A1 * | 12/2002 | Matsumoto et al. | 365/222 |
| 2003/0090359 | A1 * | 5/2003 | Ok | 338/200 |
| 2003/0149929 | A1 * | 8/2003 | White | 714/766 |
| 2005/0024969 | A1 * | 2/2005 | Kim | G11C 11/406 365/222 |
| 2006/0143372 | A1 * | 6/2006 | Walker et al. | 711/106 |
| 2006/0195289 | A1 * | 8/2006 | Choi et al. | 702/130 |
| 2006/0203589 | A1 * | 9/2006 | Lee | 365/222 |
| 2006/0245288 | A1 * | 11/2006 | Hokenmaier | 365/222 |
| 2009/0116326 | A1 * | 5/2009 | Lee | G11C 11/406 365/222 |
| 2010/0182862 | A1 * | 7/2010 | Teramoto | 365/222 |
| 2013/0301371 | A1 * | 11/2013 | Chen | 365/222 |

* cited by examiner

*Primary Examiner* — J. H. Hur

(74) *Attorney, Agent, or Firm* — Winston Hsu; Scott Margo

(57) ABSTRACT

A refresh method of a volatile memory includes at least the following steps: detecting at least one parameter of the volatile memory; selecting a target refresh type from a plurality of candidate refresh types according to the at least one parameter; and performing a refresh operation upon the volatile memory according to the target refresh type. In one embodiment, the candidate refresh types include at least a first candidate refresh type and a second candidate refresh type, each refresh command complying with the first candidate refresh type is arranged to refresh a first number of banks of the volatile memory, and each refresh command complying with the second candidate refresh type is arranged to refresh a second number of banks of the volatile memory.

16 Claims, 6 Drawing Sheets

| Parameter | | Symbol | 4GB | 8GB | 16GB | Unit |
|---|---|---|---|---|---|---|
| Required number of REFRESH commands (min) | | R | 8192 | | | - |
| average time between REFRESH commands(for reference only) Tcase 85°C | REFab | tREFI | 3.9 | | | us |
| | REFpb | tREFIpb | 0.4875 | 0.4875 | 0.4875 | us |
| REFRESH Cycle time | | tRFCab | 130 | 210 | TBD | ns |
| Per Bank REFRESH Cycle time | | tRFCpb | 60 | 90 | TBD (maybe 150) | ns |
| Burst Refresh Window = 4 x 8 x tRFCab | | tREFBW | 4.16 | 6.72 | TBD | us |

FIG. 3 RELATED ART

LPDDR2

| SDRAM Refresh Rate | Read-only | OP<2:0> | $000_B$: SDRAM Low temperature operating limit exceeded<br>$001_B$: 4x $t_{REFI}$, 4x $t_{REFIpb}$, 4x $t_{REFW}$<br>$010_B$: 2x $t_{REFI}$, 2x $t_{REFIpb}$, 2x $t_{REFW}$<br>$011_B$: 1x $t_{REFI}$, 1x $t_{REFIpb}$, 1x $t_{REFW}$ (<=85°C)<br>$100_B$: Reserved<br>$101_B$: 0.25x $t_{REFI}$, 0.25x $t_{REFIpb}$, 0.25x $t_{REFW}$, do not de-rate SDRAM AC timing<br>$110_B$: 0.25x $t_{REFI}$, 0.25x $t_{REFIpb}$, 0.25x $t_{REFW}$, de-rate SDRAM AC timing<br>$111_B$: SDRAM High temperature operating limit exceeded |
|---|---|---|---|

(A)

LPDDR3

| SDRAM Refresh Rate | Read-only | OP<2:0> | $000_B$: SDRAM Low temperature operating limit exceeded<br>$001_B$: 4x $t_{REFI}$, 4x $t_{REFIpb}$, 4x $t_{REFW}$<br>$010_B$: 2x $t_{REFI}$, 2x $t_{REFIpb}$, 2x $t_{REFW}$<br>$011_B$: 1x $t_{REFI}$, 1x $t_{REFIpb}$, 1x $t_{REFW}$ (<=85°C)<br>$100_B$: 0.5x $t_{REFI}$, 0.5x $t_{REFIpb}$, 0.5x $t_{REFW}$, do not de-rate SDRAM AC timing<br>$101_B$: 0.25x $t_{REFI}$, 0.25x $t_{REFIpb}$, 0.25x $t_{REFW}$ do not de-rate SDRAM AC timing<br>$110_B$: 0.25x $t_{REFI}$, 0.25x $t_{REFIpb}$, 0.25x $t_{REFW}$, de-rate SDRAM AC timing<br>$111_B$: SDRAM High temperature operating limit exceeded |
|---|---|---|---|

(B)

FIG. 4 RELATED ART ically rewrite the read information into the volatile memory without modification. In this way, the information in the volatile memory can be preserved correctly.
REFRESH METHOD FOR SWITCHING BETWEEN DIFFERENT REFRESH TYPES BASED ON AT LEAST ONE PARAMETER OF VOLATILE MEMORY AND RELATED MEMORY CONTROLLER

CROSS-REFERENCE TO RELATED APPLICATIONS

This application claims the benefit of U.S. provisional application No. 61/746,682, filed on Dec. 28, 2012 and incorporated herein by reference.

BACKGROUND

The disclosed embodiments of the present invention relate to performing a refresh operation upon a volatile memory, and more particularly, to a refresh method for referring to at least one parameter of a volatile memory to switch between different refresh types and related memory controller.

Memory refresh is an information maintenance technique required by a volatile memory such as a dynamic random access memory (DRAM). In a DRAM chip, the logic value of each bit is stored by the presence or absence of electric charges on a small capacitor which acts as a memory cell. The electric charges in the memory cells would leak away as time passes. Hence, the stored data would eventually be lost if there is no memory refresh. In general, the memory refresh is to read information from the volatile memory and immediately rewrite the read information into the volatile memory without modification. In this way, the information in the volatile memory can be preserved correctly.

The refresh operation and the read/write operation cannot be performed on the same storage area in the volatile memory. As a result, there is a tradeoff between the memory refresh efficiency and the data access performance. Thus, there is a need for an innovative memory refresh design which is capable of adaptively switching between different refresh types to make the volatile memory have better memory refresh efficiency under one refresh type and have better data access performance under another refresh type.

SUMMARY

In accordance with exemplary embodiments of the present invention, a refresh method for referring to at least one parameter of a volatile memory to switch between different refresh types and related memory controller are proposed.

According to a first aspect of the present invention, an exemplary refresh method of a volatile memory is disclosed. The exemplary refresh method includes at least the following steps: detecting at least one parameter of the volatile memory; selecting a target refresh type from a plurality of candidate refresh types according to the at least one parameter; and performing a refresh operation upon the volatile memory according to the target refresh type. The candidate refresh types include at least a first candidate refresh type and a second candidate refresh type, each refresh command complying with the first candidate refresh type is arranged to refresh a first number of banks of the volatile memory, and each refresh command complying with the second candidate refresh type is arranged to refresh a second number of banks of the volatile memory.

According to a second aspect of the present invention, an exemplary memory controller of a volatile memory is disclosed. The exemplary memory controller includes a detecting unit, a selecting unit and a refresh unit. The detecting unit is arranged for detecting at least one parameter of the volatile memory. The selecting unit is arranged for selecting a target refresh type from a plurality of candidate refresh types according to the at least one parameter. The refresh unit is arranged for performing a refresh operation upon the volatile memory according to the target refresh type. The candidate refresh types include at least a first candidate refresh type and a second candidate refresh type, each refresh command complying with the first candidate refresh type is arranged to refresh a first number of banks of the volatile memory, and each refresh command complying with the second candidate refresh type is arranged to refresh a second number of banks of the volatile memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a table showing LPDDR3 refresh requirement parameters (per density).

FIG. 4 shows the refresh rate calibration by LPDDR2 and the refresh rate calibration by LPDDR3.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
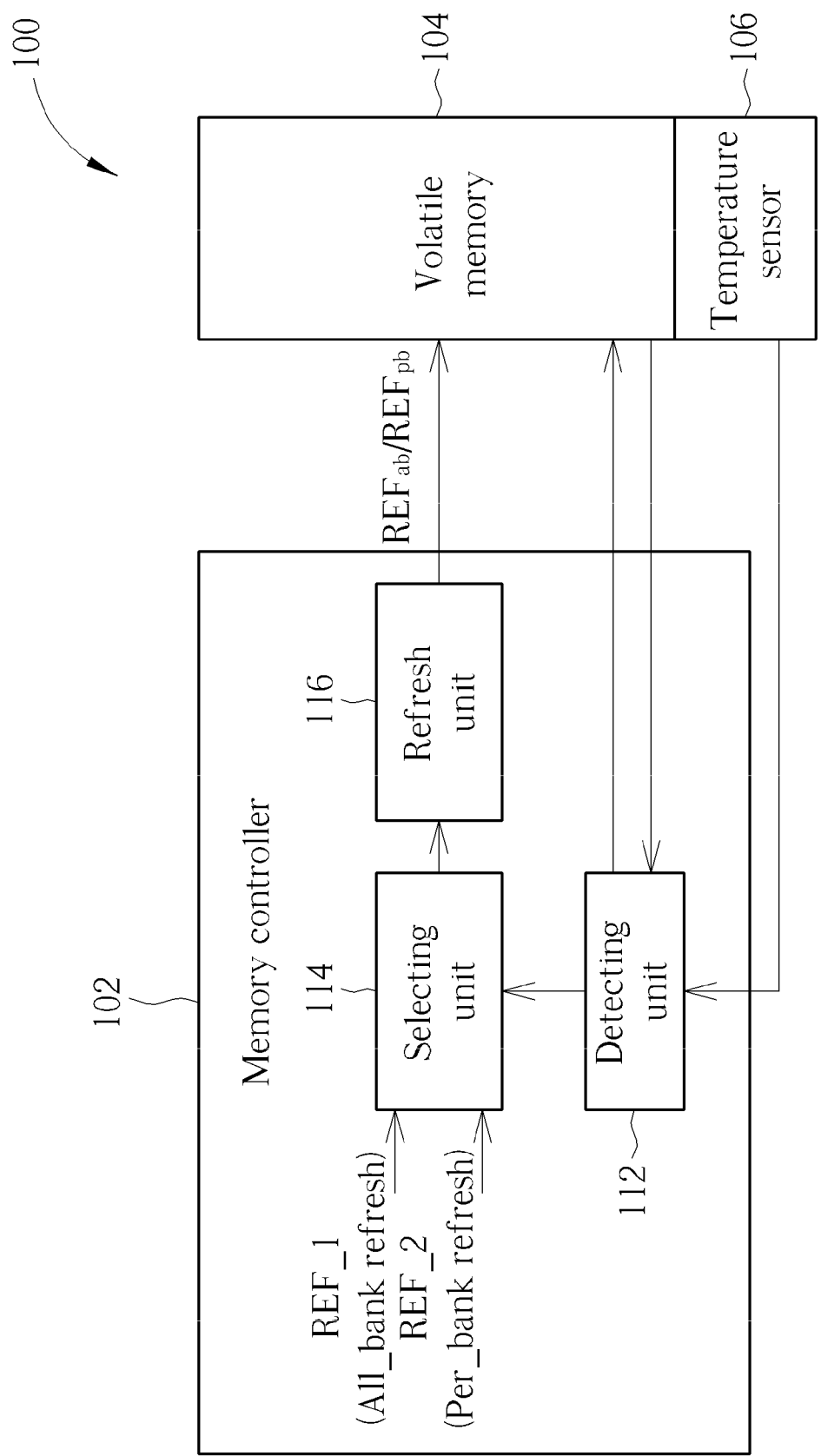
FIG. 1 is a block diagram illustrating a memory system according to an embodiment of the present invention.

FIG. 1 is a block diagram illustrating a memory system according to an embodiment of the present invention. The memory system 100 includes a memory controller 102 and a volatile memory 104. For example, the volatile memory 104 may be a DRAM such as a low-power double date rate synchronous DRAM (LPDDR SDRAM) complying with an LPDDR2 specification or an LPDDR3 specification. In this embodiment, the volatile memory 104 supports a plurality of candidate refresh types. Hence, the memory controller 102 selects a target refresh type from the candidate refresh types, and performs a refresh operation upon the volatile memory 104 by issuing refresh command(s) according to the target refresh type. By way of example, but not limitation, the candidate refresh types may include at least a first candidate refresh type REF_1 and a second candidate refresh type REF_2. Each refresh command complying with the first candidate refresh type REF_1 is arranged to refresh a first number of banks of the volatile memory 104, and each refresh command complying with the second candidate refresh type REF_2 is arranged to refresh a second number of banks of the volatile memory, where the first number is different from the second number.

For better understanding of technical features of the present invention, the first candidate refresh type REF_1 and the second candidate refresh type REF_2 mentioned in the following paragraphs are assumed to be all-bank refresh and per-bank refresh, respectively. Thus, when the target refresh type is all-bank refresh, the memory controller 102 issues an all-bank refresh command REFab to the volatile memory 104 to perform the refresh operation upon all banks (e.g., eight banks) of the volatile memory 104. When the target refresh type is per-bank refresh, the memory controller 102 issues a per-bank refresh command REFpb to the volatile memory 104 to perform the refresh operation upon one bank selected from the banks (e.g., eight banks) included in the volatile memory 104. To put it simply, assuming that the first candidate refresh type REF_1 is all-bank refresh and the second candidate refresh type REF_2 is per-bank refresh, the first number of banks refreshed by each all-bank refresh command would be larger than the second number of banks refreshed by each per-bank refresh command.

More specifically, the per-bank refresh command REFpb performs the refresh operation upon the bank which is scheduled by a bank counter in the volatile memory 104. For an example with the volatile memory 104 having eight banks, the bank sequence of the per-bank refresh may be set to be a sequential round-robin: "0-1-2-3-4-5-6-7-0-1- . . . ", or the bank sequence within a full-cycle may be changed to, for example, "0-3-2-7-1-4-5-6-1-3- . . . ". To achieve a full-cycle per-bank refresh, the memory controller 102 is required to issue eight per-bank refresh commands REFpb to the volatile memory 104, where the eight per-bank refresh commands REFpb are responsible for refreshing eight banks included in the volatile memory 104, respectively.

A target bank (e.g., bank 0) is inaccessible during the current per-bank refresh cycle; however, other banks (e.g., banks 1-7) within the volatile memory 104 are accessible and may be addressed (active) during the current per-bank refresh cycle. In other words, during the per-bank refresh operation, any of the banks other than the one currently being refreshed can be maintained in active state or accessed by a read/write command. Compared to a volatile memory refreshed using the all-bank refresh manner, a volatile memory refreshed using the per-bank refresh manner would have better data access performance.

There is a minimum delay tRFCpb between the current per-bank refresh command and the next per-bank refresh command, and there is also a minimum delay tRFCab between the current all-bank refresh command and the next all-bank refresh command. Furthermore, the minimum delay of a full-cycle per-bank refresh tRFCpb*8 is much larger than the minimum delay of all-bank refresh tRFCab (i.e., tRFCpb*8>>tRFCab). Hence, compared to a volatile memory refreshed using the per-bank refresh manner (e.g., eight banks refreshed using respective per-bank refresh commands), a volatile memory refreshed using the all-bank refresh manner (e.g., eight banks refreshed using one all-bank refresh command) would have higher refresh efficiency.

To achieve an optimized performance between memory refresh and data access, the present invention therefore proposes adaptively switching between the first candidate refresh type (e.g., all-bank refresh) and the second candidate refresh type (e.g., per-bank refresh). Further details are described as below.

As shown in FIG. 1, the memory controller 102 includes a detecting unit 112, a selecting unit 114, and a refresh unit 116. The detecting unit 112 is arranged for detecting at least one parameter of the volatile memory 104. The selecting unit 114 is coupled to the detecting unit 112, and arranged for selecting a target refresh type from candidate refresh types REF_1, REF_2 (e.g., REF_1=all-bank refresh and REF_2=per-bank refresh) according to the at least one parameter. The refresh unit 116 is coupled to the selecting unit 114, and arranged for performing a refresh operation upon the volatile memory 104 according to the target refresh type. More specifically, the selecting unit 114 refers to parameter(s) of the volatile memory 104 to decide which one of all-bank refresh and per-bank refresh should be employed for achieving better data access performance or higher refresh efficiency under the current status of the volatile memory 104.

It should be noted that, a target refresh type is dynamically/adaptively selected according to the at least one parameter of the volatile memory 104, and the target refresh type will change if any parameter is changed. The refresh unit 116 will issue the refresh command according to the target refresh type. Thus, when different memory blocks in the volatile memory 104 are refreshed one by one, each memory block may be selectively refreshed using all-bank refresh or per-bank refresh based on the current setting of at least one parameter of the volatile memory 104. As the target refresh type is dynamically/adaptively decided, the number of banks in the volatile memory 104 that are refreshed using the all-bank refresh commands may be identical to or different from the number of banks in the volatile memory that are refreshed using the per-bank refresh commands. That is, in these embodiments, the amounts and distributions of banks with different refresh types are dynamically/adaptively decided according to the at least one parameter of the volatile memory 104, rather than be pre-scheduled when the memory system is initialized.

Figure 2:
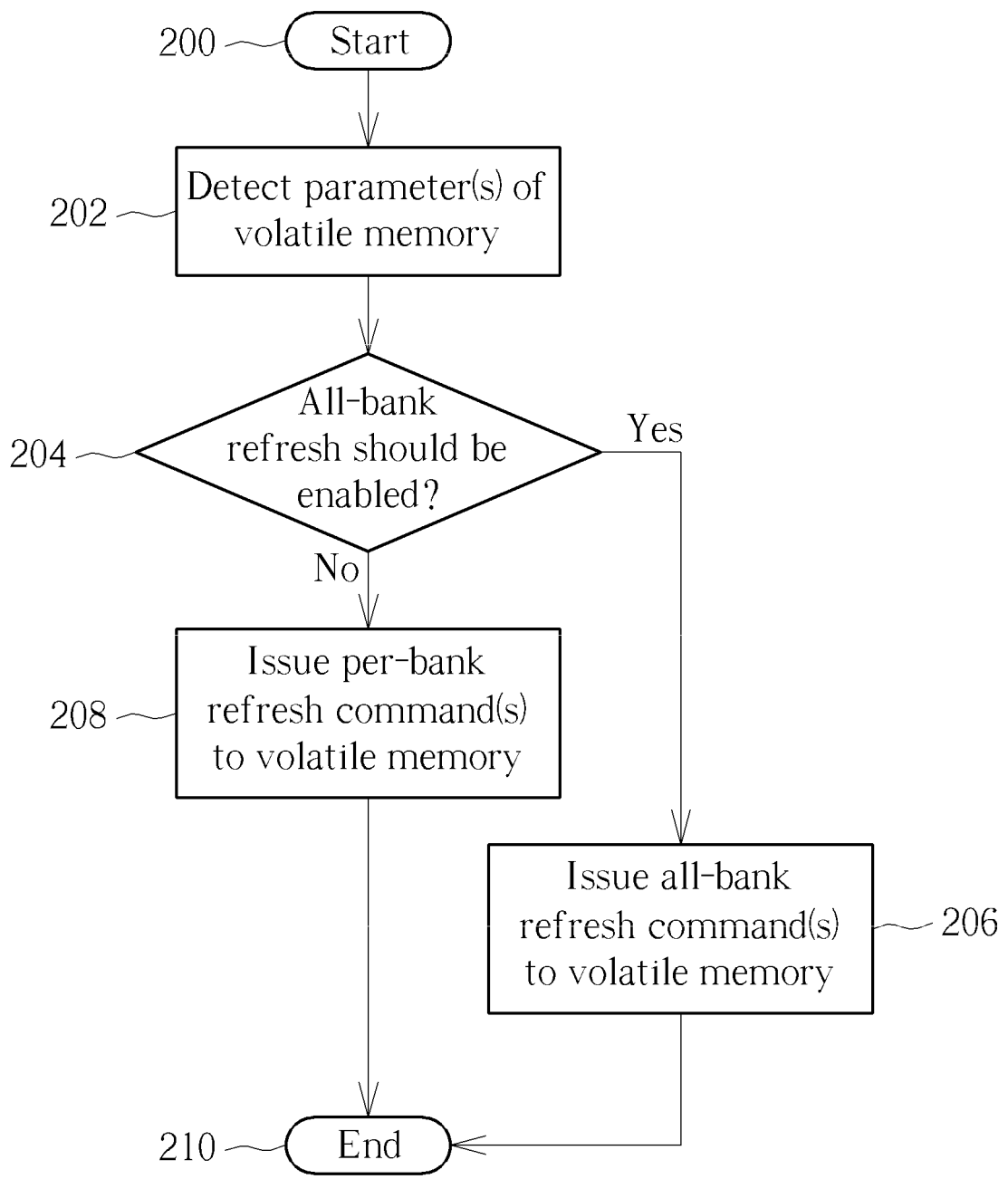
FIG. 2 is a flowchart illustrating a refresh method according to an embodiment of the present invention.

Please refer to FIG. 2, which is a flowchart illustrating a refresh method according to an embodiment of the present invention. The exemplary refresh method may be employed by the memory controller 102 shown in FIG. 1. Provided that the result is substantially the same, the steps are not required to be executed in the exact order shown in FIG. 2. The exemplary refresh method in FIG. 2 shows a general concept of the present invention, and may be briefly summarized as below.

Step 200: Start.
Step 202: Detect parameter(s) of the volatile memory 104.
Step 204: Determine if all-bank refresh should be enabled based on the parameter(s) of the volatile memory 104. If yes, go to step 206; otherwise, go to step 208.
Step 206: Issue all-bank refresh command(s) REFab to the volatile memory 104. Go to step 210.
Step 208: Issue per-bank refresh command(s) REFpb to the volatile memory 104.
Step 210: End.

Step 202 is performed by the detecting unit 112, step 204 is performed by the selecting unit 114, and steps 206, 208 are performed by the refresh unit 116.

As mentioned above, compared to the all-bank refresh, the per-bank refresh has better data access performance but lower refresh efficiency. Hence, under certain conditions, employing the per-bank refresh may fail to maintain data integrity of the volatile memory. Instead, the all-bank refresh should be employed to prevent the volatile memory 104 from losing stored data. Thus, step 204 is performed to determine which one of all-bank refresh and per-bank refresh should be enabled.

In general, the volatile memory (e.g., LPDDR SDRAM) 104 requires a minimum number of all-bank refresh commands REFab within any rolling refresh window tREFW (e.g., 32 ms). If the per-bank refresh is enabled, one all-bank refresh command REFab can be replaced with a full cycle of per-bank refresh commands REFpb (e.g., eight per-bank refresh commands). Hence, to meet the requirement of the minimum number of refresh commands, the refresh unit 116 is required to averagely issue one all-bank refresh command REFab every tREFI period under the all-bank refresh mode, and averagely issue one per-bank refresh command REFpb every tREFIpb period under the per-bank refresh mode. Besides, after issuing one all-bank refresh command REFab, the refresh unit 116 is required to wait for at least one refresh cycle time tRFCab before issuing the next all-bank refresh command REFab, where the refresh cycle time tRFCab allows all banks (e.g., eight banks) of the volatile memory 104 to be successfully refreshed. Similarly, after issuing one per-bank refresh command REFpb, the refresh unit 116 is required to wait for at least one per-bank refresh cycle time tRFCpb before issuing the next per-bank refresh command REFab, where the per-bank refresh cycle time tRFCpb allows one target bank in the volatile memory 104 to be successfully refreshed. In other words, the refresh cycle time tRFCab is a minimum delay between the current all-bank refresh command and the next all-bank refresh command, and the per-bank refresh cycle time tRFCpb is a minimum delay between the current per-bank refresh command and the next per-bank refresh command.

FIG. 3 is a table showing LPDDR3 refresh requirement parameters (per density). As can be readily seen from FIG. 3, each of the all-bank refresh cycle time tRFCab and per-bank refresh cycle time tRFCpb is positively correlated with the density (i.e., capacity or size) of the volatile memory 104. That is, the higher is the memory density, the minimum delay between refresh commands is longer. The all-bank refresh cycle time tRFCab and per-bank refresh cycle time tRFCpb do not change when temperature of the volatile memory 104 varies. That is, all-bank refresh cycle time tRFCab and per-bank refresh cycle time tRFCpb are temperature independent. However, the refresh rate/frequency of the volatile memory 104 is positively correlated with temperature of the volatile memory 104. That is, the refresh window tREFW is temperature dependent, and becomes shorter when temperature of the volatile memory 104 is higher. Hence, as the minimum number of refresh commands within each rolling refresh window tREFW is temperature independent, the average time between all-bank refresh commands tREFI would be reduced when the temperature of the volatile memory 104 is higher, and the average time between per-bank refresh commands tREFIpb would be reduced when the temperature of the volatile memory 104 is higher. To put it another way, when temperature of the volatile memory 104 becomes higher, the refresh rate/frequency should be increased to achieve the objective of maintaining the data integrity. Therefore, the average time between refresh commands tREFI/tREFIpb becomes shorter correspondingly.

The refresh rate calibration by LPDDR2 is shown in sub-diagram (A) of FIG. 4, and the refresh rate calibration by LPDDR3 is shown in sub-diagram (B) of FIG. 4. In one exemplary design, the volatile memory 104 is equipped with a temperature sensor 106, where the temperature sensor 106 may be integrated within a memory chip where the volatile memory 104 is located or disposed outside of the memory chip. Based on the temperature measured by the temperature sensor 106, the volatile memory 104 can inform the memory controller 102 of the refresh rate needed, where the refresh rate may be indicated by a bit sequence composed of three bits as shown in FIG. 4. The memory controller 102 can issue a Mode Register Read (MRR) command to read the refresh rate from the volatile memory 104, and then update the frequency of issuing refresh commands. For example, an MR4 command is issued to read an MR4 register, and the refresh rate is obtained from the MR4 output generated in response to the MR4 command. As can be seen from FIG. 4, when the temperature is higher than 85° C., the memory controller 102 is instructed to have the refresh window tREFW and the average time between refresh commands tREFI, tREFIpb multiplied by a number smaller than 1 (e.g., 0.25).

As mentioned above, the minimum delay tREFCpb between the current per-bank refresh command and the next per-bank refresh command is increased when the density of the volatile memory 104 is large. Hence, when the memory temperature and memory density is high, there is high probability that the per-bank refresh cycle time tRFCpb is longer than the average time between per-bank refresh commands tREFIpb. If a memory controller employs per-bank refresh under high memory temperature and high memory density, the memory controller may fail to generate the minimum number of refresh commands within one reduced refresh window tREFW. As a result, the information stored in a volatile memory may be lost.

Consider a case where the volatile memory 104 has 8 banks, the density of the volatile memory 104 is 8 GB, and the refresh rate read by the MR4 command is 5 (decimal representation) or 101 (binary representation). The refresh window tREFW and the average time between refresh commands tREFI, tREFIpb have to be multiplied by 0.25. Hence, tREFI=3.9*0.25=0.975 (us)=975 (ns), and tREFIpb=0.4875*0.25=0.121875 (us)=121.875 (ns), where tREFIpb=tREFI/8. As mentioned above, the minimum delay tREFCpb does not change in response to temperature variation. Hence, tREFCpb=90 (ns). The full cycle of eight per-bank refresh commands REFpb should spend at least 90 (ns)*8=720 (ns), which is shorter than but close to tREFIpb*8 (i.e., 121.875 (ns)*8=975 (ns)). Hence, other commands cannot block or delay the per-bank refresh command REFpb, otherwise the speed of issuing the per-bank refresh commands REFpb is not enough to satisfy the refresh rate the volatile memory 104 needs. Specifically, the memory controller 102 should not issue the command that will block the per-bank refresh command REFpb, like a read/write command which accesses the same bank required to be refreshed.

If the memory density is higher, the phenomenon is intensified due to increased minimum delay between two refresh commands. If the per-bank refresh cycle time tRFCpb is longer than the average time between refresh commands tREFIpb that the volatile memory 104 needs to maintain data integrity, the memory controller 102 should issue all-bank commands REFab rather than per-bank refresh commands REFpb. For example, when the refresh rate obtained by the MR4 command is equal to 5 (decimal representation) or 101 (binary representation), the average time between per-bank refresh commands should be multiplied by 0.25. That is, tREFIpb=0.4875*0.25=0.121875 (us)=121.875 (ns). Therefore, the minimum delay between per-bank refresh commands tRFCpb cannot be larger than 121.875 (ns) in a 16 GB LPDDR3 SDRAM, otherwise the speed of issuing the per-bank refresh commands REFpb is not enough and the stored information will be lost. However, the probability of the minimum delay between per-bank refresh commands tRFCpb being larger than the average time between per-bank refresh commands tREFIpb (i.e., 121.875 (ns)) for a 16 GB LPDDR3 SDRAM is quite high. For example, the minimum delay between per-bank refresh commands tRFCpb for a 16 GB LPDDR3 SDRAM may be defined to be 150 (ns).

As mentioned above, if the per-bank refresh is employed, the frequency of issuing the per-bank refresh commands REFpb to the volatile memory 104 may not be enough when the memory temperature is high (e.g., refresh rate 5). However, all-bank refresh does not have this problem. This is because tRFCab=130 ns (4 GB) or 210 ns (8 GB), and tREFI is 975 (ns) when refresh rate is equal to or larger than five. Even though there are some commands which may block the all-bank refresh command REFab, there is still a large time margin (i.e., tREFI−tRFCab). Hence, when the memory temperature is high (e.g., refresh rate 5), the memory controller 102 issues all-bank refresh commands REFab rather than per-bank refresh commands REFpb, thereby avoiding the data loss problem caused by insufficient refresh commands within one refresh window tREFW.

When parameters indicate that the memory temperature and memory density is not high enough to make the volatile memory 104 prone to lose data, the selecting unit 114 of the memory controller 102 may refer to other parameters to decide which one of the first candidate refresh type REF_1 (e.g., all-bank refresh) and the second candidate refresh type (e.g., per-bank refresh) should be selected as the target refresh type. For example, a parameter detected by the detecting unit 112 may indicate whether all of the banks in the volatile memory 104 are idle now. When any of the banks is not idle, the selecting unit 114 selects the per-bank refresh such that the refresh unit 116 issues per-bank refresh commands REFpb to the volatile memory 104 for achieving better data access performance. When all of the banks are idle, none of the banks is accessed for data read or data write. Hence, the selecting unit 114 selects the all-bank refresh such that the refresh unit 116 issues all-bank refresh commands REFab to the volatile memory 104 for achieving higher refresh efficiency.

Further, a parameter detected by the detecting unit 112 may indicate whether a predetermined number of refresh commands complying with the first candidate refresh type (e.g., all-bank refresh) have been issued in a burst refresh window (e.g., tREFBW=4×8×tRFCab, as shown in FIG. 3). For example, to limit the current consumption, at most eight all-bank refresh commands REFab are allowed to be issued in each burst refresh window tREFBW. However, this limitation is not applied to the per-bank refresh commands REFpb. Therefore, when it is determined that eight all-bank refresh commands REFab have been issued in one burst refresh window, the selecting unit 114 can switch the target refresh type from the all-bank refresh to the per-bank refresh, thus allowing the refresh unit 116 to issue refresh commands continuously. This is also good for performance.

Briefly summarized, the at least one parameter detected by the detecting unit 112 may include temperature of the volatile memory 104 that is provided by the temperature sensor 106, a refresh control parameter (e.g., refresh rate) which is set in response to temperature of the volatile memory 104, density of the volatile memory 104, one parameter which indicates whether all banks of the volatile memory 104 are idle, and/or one parameter which indicates whether a predetermined number of refresh commands complying with the first candidate refresh type (e.g., all-bank refresh) have been issued in a burst refresh window. Based on memory's parameter(s), the selecting unit 114 checks predetermined criteria to decide which one of the candidate refresh types (e.g., all-bank refresh and per-bank refresh) should be selected.

Figure 5:
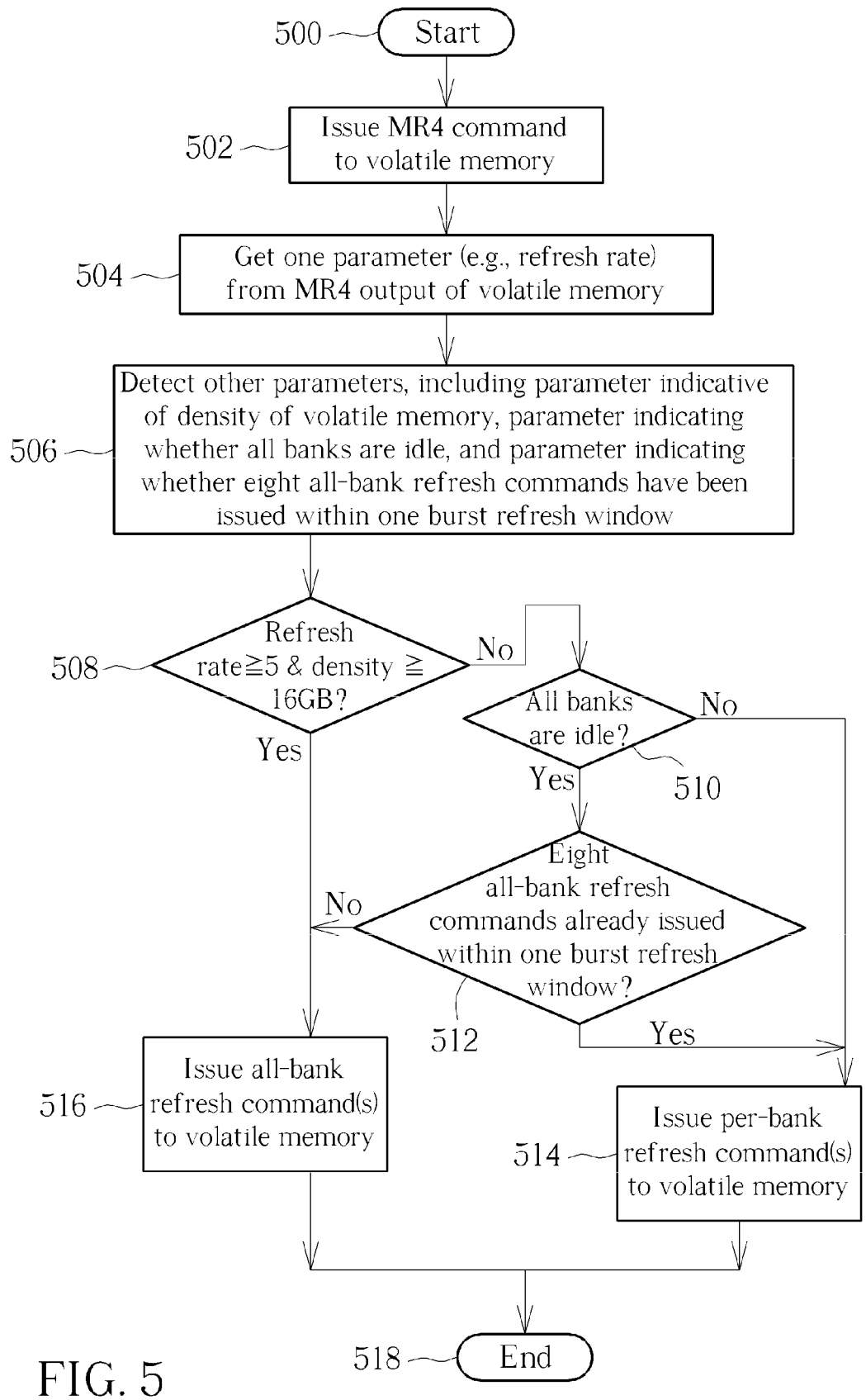
FIG. 5 is a flowchart illustrating a refresh method according to another embodiment of the present invention.

Please refer to FIG. 5, which is a flowchart illustrating a refresh method according to another embodiment of the present invention. The exemplary refresh method may be employed by the memory controller 102 shown in FIG. 1. Provided that the result is substantially the same, the steps are not required to be executed in the exact order shown in FIG. 5. The exemplary refresh method may be briefly summarized as below.

Step 500: Start.

Step 502: Issue an MR4 command to the volatile memory 104.

Step 504: Get one parameter (e.g., refresh rate) from an MR4 output of the volatile memory 104.

Step 506: Detect other parameters, including a parameter indicative of density of the volatile memory 104, a parameter indicating whether all banks are idle, and a parameter indicating whether eight all-bank refresh commands REFab have been issued within one burst refresh window tREFBW.

Step 508: Check if refresh rate ≥5 & density ≥16 GB. If yes, go to step 516; otherwise, go to step 510.

Step 510: Check if all banks are idle. If yes, go to step 512; otherwise, go to step 514.

Step 512: Check if eight all-bank refresh commands REFab have been issued within one burst refresh window tREFBW. If yes, go to step 514; otherwise, go to step 516.

Step 514: Issue per-bank refresh command(s) REFpb to the volatile memory 104. Go to step 518.

Step 516: Issue all-bank refresh command(s) REFab to the volatile memory 104.

Step 518: End.

Steps 502-506 are performed by the detecting unit 112, steps 508, 510, 512 are performed by the selecting unit 114, and steps 514, 516 are performed by the refresh unit 116. As a person skilled in the art can readily understand details of each step after reading above paragraphs, further description is omitted here for brevity.

In above embodiment shown in FIG. 5, the refresh rate obtained from the MR4 output given by the volatile memory 104 can serve as an indication of the temperature of the volatile memory 104 due to the fact that the refresh rate is a temperature-dependent parameter. Thus, when the refresh rate is found equal to or larger than 5 (decimal representation)/101(binary representation), the selecting unit 114 determines that the memory temperature is higher than a threshold (e.g., 85° C.). In an alternative design, the detecting unit 112 may directly obtain temperature of the volatile memory 104 from the temperature sensor 106, such that the selecting unit 114 directly checks a temperature value received by the detecting unit 112 to decide whether the memory temperature is higher than a threshold.

Figure 6:
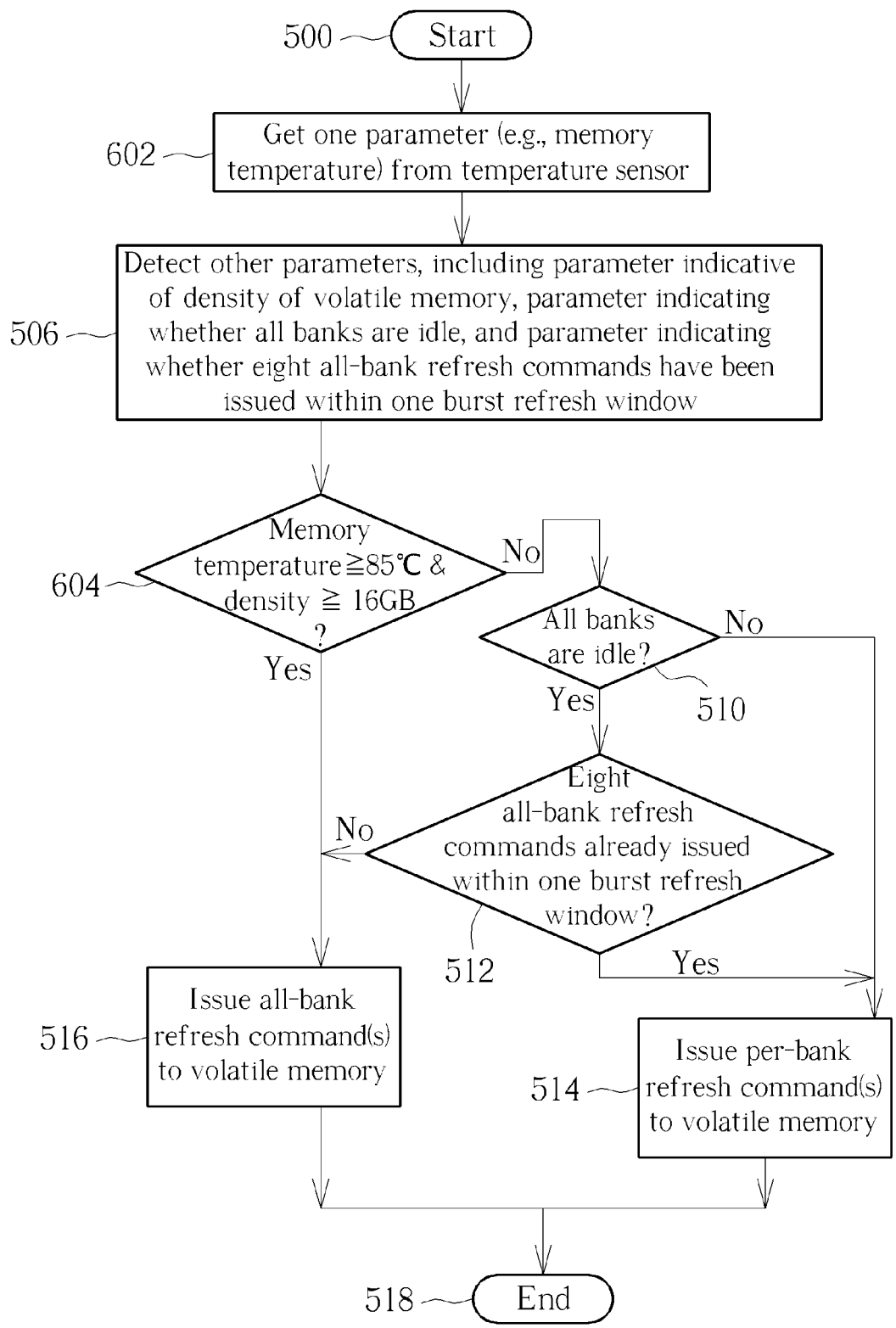
FIG. 6 is a flowchart illustrating a refresh method according to yet another embodiment of the present invention.

Please refer to FIG. 6, which is a flowchart illustrating a refresh method according to yet another embodiment of the present invention. The exemplary refresh method may be employed by the memory controller 102 shown in FIG. 1. The major difference between the embodiments shown in FIG. 5 and FIG. 6 is that steps 502-504 are replaced with step 602, and step 508 is replaced with step 604. In this embodiment, step 602 is performed to get one parameter (e.g., memory temperature) from the temperature sensor 106, and step 604 is performed to check if memory temperature ≥85° C. & density ≥16 GB. When the predetermined criterion is met (i.e., memory temperature ≥85° C. & density 16 GB), the flow proceeds with step 516, otherwise the flow proceeds with step 510. Step 602 is performed by the detecting unit 112, and step 604 is performed by the selecting unit 114. As a person skilled in the art can readily understand details of each step after reading above paragraphs, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A refresh method of a volatile memory, comprising:
detecting at least one parameter of the volatile memory, wherein the at least one parameter indicates whether a predetermined number of refresh commands complying with a first candidate refresh type have been issued in a burst refresh window;
selecting a target refresh type from a plurality of candidate refresh types according to the at least one parameter; and
performing a refresh operation upon the volatile memory according to the target refresh type;
wherein the candidate refresh types include at least the first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is larger than the second number;
wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number;
wherein when the first candidate refresh type is selected as the target refresh type, the volatile memory sequentially receives more than one refresh command complying with the first candidate refresh type.

2. The refresh method of claim 1, wherein the first candidate refresh type is all-bank refresh.

3. The refresh method of claim 1, wherein the second candidate refresh type is per-bank refresh.

4. The refresh method of claim 1, wherein the at least one parameter indicates whether all banks of the volatile memory are idle.

5. A refresh method of a volatile memory, comprising:
detecting at least one parameter of the volatile memory, wherein the at least one parameter includes temperature of the volatile memory;
selecting a target refresh type from a plurality of candidate refresh types according to the at least one parameter; and
performing a refresh operation upon the volatile memory according to the target refresh type;
wherein the candidate refresh types include at least a first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is different from the second number;
wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number.

6. A refresh method of a volatile memory, comprising:
detecting at least one parameter of the volatile memory, wherein the at least one parameter includes a refresh control parameter which is set in response to temperature of the volatile memory;
selecting a target refresh type from a plurality of candidate refresh types according to the at least one parameter; and
performing a refresh operation upon the volatile memory according to the target refresh type;
wherein the candidate refresh types include at least a first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is different from the second number;
wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number.

7. The refresh method of claim 6, wherein the refresh control parameter is a refresh rate of the volatile memory.

8. A refresh method of a volatile memory, comprising:
detecting at least one parameter of the volatile memory, wherein the at least one parameter includes density of the volatile memory;
selecting a target refresh type from a plurality of candidate refresh types according to the at least one parameter; and
performing a refresh operation upon the volatile memory according to the target refresh type;
wherein the candidate refresh types include at least a first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is different from the second number;
wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number.

9. A memory controller of a volatile memory, comprising:
a detecting unit, arranged for detecting at least one parameter of the volatile memory, wherein the at least one parameter indicates whether a predetermined number of refresh commands complying with a first candidate refresh type have been issued in a burst refresh window;

a selecting unit, arranged for selecting a target refresh type from a plurality of candidate refresh types according to the at least one parameter; and a refresh unit, arranged for performing a refresh operation upon the volatile memory according to the target refresh type;

wherein the candidate refresh types include at least the first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is larger than the second number;

wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number;

wherein when the first candidate refresh type is selected as the target refresh type, the refresh unit sequentially generates more than one refresh command complying with the first candidate refresh type to the volatile memory.

10. The memory controller of claim 9, wherein the first candidate refresh type is all-bank refresh.

11. The memory controller of claim 9, wherein the second candidate refresh type is per-bank refresh.

12. The memory controller of claim 9, wherein the at least one parameter indicates whether all banks of the volatile memory are idle.

13. A memory controller of a volatile memory, comprising:
a detecting unit, arranged for detecting at least one parameter of the volatile memory, wherein the at least one parameter includes temperature of the volatile memory;

a selecting unit, arranged for selecting a target refresh type from a plurality of candidate refresh types according to the at least one parameter; and a refresh unit, arranged for performing a refresh operation upon the volatile memory according to the target refresh type;

wherein the candidate refresh types include at least a first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is different from the second number;

wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number.

14. A memory controller of a volatile memory, comprising:
a detecting unit, arranged for detecting at least one parameter of the volatile memory, wherein the at least one parameter includes a refresh control parameter which is set in response to temperature of the volatile memory;

a selecting unit, arranged for selecting a target refresh type from a plurality of candidate refresh types according to the at least one parameter; and a refresh unit, arranged for performing a refresh operation upon the volatile memory according to the target refresh type;

wherein the candidate refresh types include at least a first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is different from the second number;

wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number.

15. The memory controller of claim 14, wherein the refresh control parameter is a refresh rate of the volatile memory.

16. A memory controller of a volatile memory, comprising:
a detecting unit, arranged for detecting at least one parameter of the volatile memory, wherein the at least one parameter includes density of the volatile memory;

a selecting unit, arranged for selecting a target refresh type from a plurality of candidate refresh types according to the at least one parameter; and a refresh unit, arranged for performing a refresh operation upon the volatile memory according to the target refresh type;

wherein the candidate refresh types include at least a first candidate refresh type and a second candidate refresh type, each refresh command complying with the first candidate refresh type is arranged to refresh a first number of banks of the volatile memory, each refresh command complying with the second candidate refresh type is arranged to refresh a second number of banks of the volatile memory, and the first number is different from the second number;

wherein when the first candidate refresh type is selected as the target refresh type, multiple banks in the volatile memory are refreshed by using a third number of refresh commands complying with the first candidate refresh type; when the second candidate refresh type is selected as the target refresh type, the same multiple banks in the volatile memory are refreshed by using a fourth number of refresh commands complying with the second candidate refresh type; and the third number is different from the fourth number.

* * * * *